(12) United States Patent
Sarbishaei et al.

(10) Patent No.: US 9,859,845 B2
(45) Date of Patent: Jan. 2, 2018

(54) DUAL-BAND SIGNAL TRANSMISSION

(71) Applicant: Telefonaktiebolaget LM Ericsson (Publ), Stockholm (SE)

(72) Inventors: Hassan Sarbishaei, Kitchener (CA); Yushi Hu, Mississauga (CA); Slim Boumaiza, Waterloo (CA)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 15/119,328

(22) PCT Filed: May 21, 2014

(86) PCT No.: PCT/IB2014/061604
§ 371 (c)(1),
(2) Date: Aug. 16, 2016

(87) PCT Pub. No.: WO2015/128701
PCT Pub. Date: Sep. 3, 2015

(65) Prior Publication Data
US 2017/0012585 A1    Jan. 12, 2017

Related U.S. Application Data

(60) Provisional application No. 61/946,315, filed on Feb. 28, 2014.

(51) Int. Cl.
| | |
|---|---|
| *H03F 1/30* | (2006.01) |
| *H03F 1/02* | (2006.01) |
| *H03F 3/24* | (2006.01) |
| *H03F 3/19* | (2006.01) |
| *H03F 3/21* | (2006.01) |

(52) U.S. Cl.
CPC ......... *H03F 1/0216* (2013.01); *H03F 1/0222* (2013.01); *H03F 3/19* (2013.01); *H03F 3/21* (2013.01); *H03F 3/24* (2013.01); *H03F 2200/102* (2013.01); *H03F 2200/451* (2013.01)

(58) Field of Classification Search
CPC .................................... H03F 1/30; H03F 3/04
USPC ......................................... 330/297, 296, 285
See application file for complete search history.

(56) References Cited

U.S. PATENT DOCUMENTS 5,936,464 A * 8/1999 Grondahl .............. H03F 1/0222
330/10
6,043,707 A * 3/2000 Budnik .................... H03C 5/00
330/10

(Continued)

OTHER PUBLICATIONS

International Search Report and Written Opinion dated Sep. 2, 2014 for International Application Serial No. PCT/IB2014/061604, International Filing Date—May 21, 2014 consisting of 9-pages.

(Continued)

*Primary Examiner* — Henry Choe
(74) *Attorney, Agent, or Firm* — Patent Portfolio Builders, PLLC (57) ABSTRACT

A method and system for modulating a drain supply voltage of a power amplifier are disclosed. A low pass envelope of a dual band modulated signal input to the power amplification system is determined. The determined low pass envelope is amplified. A drain supply of the power amplifier is modulated based on the amplified determined low pass envelope.

16 Claims, 8 Drawing Sheets

(56) References Cited

U.S. PATENT DOCUMENTS

| | | | | |
|---|---|---|---|---|
| 6,049,703 | A * | 4/2000 | Staudinger | H03F 1/0222 330/10 |
| 8,160,519 | B2 * | 4/2012 | Nentwig | H03F 1/0211 375/285 |
| 8,902,002 | B2 * | 12/2014 | Fagg | H03F 1/0266 330/127 |
| 9,071,487 | B2 * | 6/2015 | Pratt | H04L 25/03828 |
| 9,288,098 | B2 * | 3/2016 | Yan | H04B 1/0475 |
| 2006/0209984 | A1 * | 9/2006 | Kenington | H03F 1/0222 375/297 |
| 2010/0085120 | A1 * | 4/2010 | Marbell | H03F 1/0266 330/296 |

OTHER PUBLICATIONS

Giovannelli et al.—"A Concurrent Dual Band 870 and 1970 MHz 10 W Envelope Tracking PA Designed by a WCDMA Probability Distribution Conscious Approach", 2011 IEEE Topical Conference on Power Amplifiers for Wireless and Radio Applications (PAWR); Phoenix, AZ, USA, Jan. 16-19, 2011 consisting of 4-pages.

Cidronali et al.—"Bi-Dimensional Shaping Function in Concurrent Dual Band GaAs Envelope Tracking Power Amplifier", 2012 IEEE Topical Conference on Power Amplifiers for Wireless and Radio Applications (PAWR); Santa Clara, CA, USA, pp. 29-32, Jan. 15, 2012 consisting of 4-pages.

Li et al.—"A New Envelope Tracking Technique for Concurrent Duan-Band PAs", Published in: 2012 2nd International Conference on Consumer Electronics, Communications and Networks (CECNET), pp. 39-42, Apr. 21, 2012 consistng of 4-pages.

Yu_et al.—"A Siingle Envelope Modulator-Based Envelope-Tracking Structure for Multiple-Input and Multiple-Output Wireless Transmitters", IEEE Transactins on Microwave Theory and Techniques, vol. 60(10), pp. 3317-3327, Oct. 1, 2012 consisitng of 11-pages.

Gilabert et al.—"3D Digital Predistortion for Dual-Band Envelope Tracking Power Amplifiers" 2013 Asia-Pacific Microwave Conference Proceedings (APMC), pp. 734-736, Nov. 5, 2013, consisting of 3-pages.

* cited by examiner

DUAL-BAND SIGNAL TRANSMISSION

CROSS-REFERENCE TO RELATED APPLICATIONS

This Application is a Submission Under 35 U.S.C. §371 for U.S. National Stage Patent Application of International Application No. PCT/IB2014/061604, filed May 21, 2014 entitled "DUAL-BAND SIGNAL TRANSMISSION," which claims priority to U.S. Provisional Application No. 61/946,315, filed Feb. 28, 2014, entitled "DUAL-BAND SIGNAL TRANSMISSION," the entirety of both which are incorporated herein by reference.

TECHNICAL FIELD

The present invention relates to power amplifiers and in particular, envelope tracking for modulation of a drain supply of a power amplifier.

BACKGROUND

Advanced wireless communication systems and technologies require techniques to maximize spectral efficiency and data throughput to enable the transmission of large amounts of media content. The quest for ubiquitous networks with adaptive spectrum management calls for radio systems capable of processing multi-standard and multi-band signals. This has been traditionally addressed by deploying multiple dedicated transmitters/power amplifiers (PAs) to cover a given set of frequency bands. However, as the number of covered bands increases, this approach results in highly complex, large sized and expensive radio systems. A more suitable and cost efficient solution is to use one multi-band/multi-standard transmitter/PA to transmit a multi-band, multi-standard and multicarrier signal. While this approach addresses the disadvantage of the traditional solution, it brings challenges in terms of linearity and power efficiency.

In order to maximize spectral efficiency and data throughput, emerging wireless standards are yielding communication signals characterized by high peak-to-average power ratios (PAPR). Hence, future communication infrastructure will require highly power efficient, ultra-linear, multi-standard/multi-band radio systems. Recently, power efficiency enhancement techniques such as Doherty amplifiers and envelope tracking (ET) have been successfully applied to enhance the power efficiency of power amplifiers (PAs) driven with single-band modulated signals.

There have been several attempts to extend the Doherty amplifier to concurrent amplification of multi-standard/multi-band signals. This has been mainly attempted by extending the bandwidth of the Doherty amplifier to encompass more than one communication band, or by developing a Doherty amplifier capable of operating at two discrete frequencies.

Envelope tracking (ET) involves modulating the drain supply of the PA by an amplified envelope of the input signal. Envelope tracking has proven to be a serious contender to be a primary efficiency enhancement technique. However, efficiency and linearity analysis for ET have only been validated using single-band stimuli.

SUMMARY

Methods and apparatus for modulating a drain supply voltage of a power amplifier for dual band signal transmission are disclosed. According to one aspect, a method of envelope tracking modulation of a power amplifier in a power amplification system is provided. The method includes determining a low pass envelope of a dual band modulated signal input to the power amplification system. The method also includes amplifying the determined low pass envelope. A drain supply of the power amplifier is modulated based on the amplified determined low pass envelope.

According to this aspect, in some embodiments, the low pass envelope is an envelope of an envelope of the dual band modulated signal. In some embodiments, the dual band modulated signal, $v_{DB}(t)$, is of the form:

$$v_{DB}(t) = v_1(t) + v_2(t)$$
$$= I_1(t)\cos(\omega_{c1}t) + Q_1(t)\sin(\omega_{c1}t) +$$
$$I_2(t)\cos(\omega_{c2}t + \theta_0) + Q_2(t)\sin(\omega_{c2}t + \theta_0);$$

where $\omega_{c1}$ is a carrier frequency of the first signal, $v_1$, of the dual band modulated signal, $\omega_{c2}$ is a carrier frequency of the second signal, $v_2$, of the dual band modulated signal, $\theta_o$ is a phase offset, I and Q are in-phase and quadrature components of $v$ and wherein the low pass envelope is given by:

$$a_{LF}(t) = (\sqrt{I_1^2(t)+Q_1^2(t)} + \sqrt{I_2^2(t)+Q_2^2(t)}).$$

In some embodiments, a bandwidth of the low pass envelope is about equal to a largest bandwidth of individual signals comprising the dual band modulated signal. In some embodiments, the determined low pass envelope is shaped according to a polynomial function of the determined low pass envelope prior to the amplifying. In some embodiments, the method further includes pre-distorting the dual band modulated signal according to a dual band baseband equivalent Volterra model extended to compensate for distortion attributable to the drain supply modulation. The dual band baseband equivalent extended to compensate for distortion attributable to the drain supply modulation may be of the form:

$$\tilde{y}_i(n) = f_i(\tilde{x}_1, \tilde{x}_2) \times \Sigma_{i=0}^{N_S-1} c_i^{(l)}(|\tilde{x}_1(n)| + |\tilde{x}_2(n)|)^l$$

where $f_i$ is a dual band describing function without drain supply modulation for band i, $N_S$ is a nonlinearity order the an effect of the drain supply modulation, $c_i$ are model coefficients for band i, and wherein $\tilde{x}_1$ and $\tilde{x}_2$ are baseband equivalent envelopes of individual signals comprising the dual band modulated signal. In some embodiments, the coefficients, $c_i$ are identified linearly using a least square error estimator.

According to another aspect, the invention provides a power amplification system using envelope tracking for a power amplifier, the power amplifier having an input, an output and a drain supply. The power amplification system includes a low pass envelope detector configured to determine a low pass envelope of a multi-band modulated signal input to the power amplification system, and to output the determined low pass envelope. An envelope amplifier is configured to modulate a drain supply of the power amplifier according to the determined low pass envelope received from the envelope shaper.

According to this aspect, in some embodiments, the low pass envelope detector is configured to detect an envelope of an envelope of the multi-band modulated signal. In some embodiments, the multi-band modulated signal is a dual band modulated signal, $v_{DB}(t)$, of the form:

$$v_{DB}(t) = v_1(t) + v_2(t)$$
$$= I_1(t)\cos(\omega_{c1}t) + Q_1(t)\sin(\omega_{c1}t) +$$
$$I_2(t)\cos(\omega_{c2}t + \theta_0) + Q_2(t)\sin(\omega_{c2}t + \theta_0);$$

where $\omega_{c1}$ is a carrier frequency of the first signal, $v_1$, of the dual band modulated signal, $\omega_{c2}$ is a carrier frequency of the second signal, $v_2$, of the dual band modulated signal, $\theta_o$ is a phase offset, I and Q are in-phase and quadrature components of $v$ and wherein the low pass envelope is given by $$a_{LF}(t) = \sqrt{I_1^2(t)+Q_1^2(t)} + \sqrt{I_2^2(t)+Q_2^2(t)}).$$

In some embodiments, a bandwidth of the low pass envelope is about equal to a largest bandwidth of individual signals comprising the multi-band modulated signal. In some embodiment, the power amplification system further includes an envelope shaper configured to receive and shape the determined low pass envelope according to a polynomial function of the determined low pass envelope, and to output the shaped determined low pass envelope to the envelope amplifier. In some embodiments, the power amplification system further includes a pre-distorter configured to pre-distort the dual band modulated signal according to a multi-band baseband equivalent Volterra model extended to compensate for distortion attributable to the drain supply modulation. In some embodiments, the multi-band baseband equivalent Volterra model extended to compensate for distortion attributable to the drain supply modulation is a dual band model of the form:

$$\tilde{y}_i(n) = f_i(\tilde{x}_1, \tilde{x}_2) \times \Sigma_{i=0}^{N_S-1} c_i^{(i)} (|\tilde{x}_1(n)| + |\tilde{x}_2(n)|)^i$$

where $f_i$ is a dual band describing function without drain supply modulation for band i, $N_S$ is a nonlinearity order for an effect of the drain supply modulation, $c_i$ are model coefficients for band i, and wherein $\tilde{x}_1$ and $\tilde{x}_2$ are baseband equivalent envelopes of individual signals comprising the multi-band modulated signal. In some embodiments, the power amplification system may include a least square estimator configured to linearly identify the coefficients, $c_i$.

According to yet another aspect, the invention provides a power amplification system using envelope tracking. The power amplification system includes a low pass envelope detector configured to determine a low pass envelope of a multi-band modulated signal input to the power amplification system and to output the determined low pass envelope. An envelope amplifier is configured to receive and amplify the determined low pass envelope to produce an envelope amplifier output. A power amplifier has a drain supply that is modulated by the envelope amplifier output received from the envelope amplifier.

According to this aspect, in some embodiments, a bandwidth of the low pass envelope is about equal to a largest bandwidth of individual signals comprising the multi-band modulated signal. In some embodiments, the power amplification system further includes a pre-distorter configured to pre-distort the multi-band modulated signal according to a multi-band baseband equivalent Volterra model extended to compensate for distortion attributable to the drain supply modulation. In some embodiments, the multi-band baseband equivalent Volterra model is extended by multiplication by a function of the low pass envelope.

DETAILED DESCRIPTION

Before describing in detail exemplary embodiments that are in accordance with the present invention, it is noted that the embodiments reside primarily in combinations of apparatus components and processing steps related to modulation of the drain supply of a power amplifier. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Envelope tracking is a technique by which a drain supply voltage of a power amplifier is modulated by the envelope of an input signal to be amplified by the power amplifier in order to improve efficiency of the amplified signal. Embodiments described herein employ envelope tracking via modulating the drain supply voltage of a power amplifier with a low frequency component of the envelope of the multi-band signal to be amplified. The low frequency component may be the envelope of the envelope of the multi-band signal. By using the low frequency component of the envelope, an envelope amplifier with a lower bandwidth may be used, resulting in greater efficiency and lower cost as compared with conventional envelope tracking. Further, the multi-band input may be pre-distorted using a baseband equivalent Volterra model extended to compensate for distortion attributable to the drain supply modulation. Note that although some embodiments described herein are for dual-band inputs, the methods and principles described herein also apply to multi-band inputs greater than two.

Some embodiments provide concurrent dual band envelope tracking (ET) operation of a power amplifier. The individual signals of the dual band signal input to a power amplification system using ET are of the form:

$$v_1(t)=I_1(t)\cos(\omega_{c1}t)+(t)\sin(\omega_{c1}t)v_2(t)=I_2(t)\cos(\omega_{c2}t+\theta_0)+Q_2(t)\sin(\omega_{c2}t+\theta_0) \quad (1)$$

where $\omega_{c1}$ and $\omega_{c2}$ denote the two carrier frequencies, and $I_1(t)$, $I_2(t)$, $Q_1(t)$ and $Q_2(t)$ represent the in-phase and quadrature components of the signals in band 1 and 2 respectively. $\theta_0$ designates the phase shift between the two carrier frequencies. Combining the two modulated signals yields the concurrent dual-band signal which is expressed as:

$$\begin{aligned} v_{DB}(t) &= v_1(t)+v_2(t) \\ &= I_1(t)\cos(\omega_{c1}t)+Q_1(t)\sin(\omega_{c1}t)+ \\ &\quad I_2(t)\cos(\omega_{c2}t+\theta_0)+Q_2(t)\sin(\omega_{c2}t+\theta_0) \end{aligned} \quad (2)$$

Rewriting equation (2) results in:

$$v_{DB}(t)=\hat{I}(t)\cos(\omega_{c1}t)+\hat{Q}(t)\sin(\omega_{c1}t) \quad (3)$$

where, $$\hat{I}(t)=I_1(t)+I_2(t)\cos(\Delta\omega+\theta_0)+Q_2(t)\sin(\Delta\omega t+\theta_0), \quad (4)$$

$$\hat{Q}(t)=Q_1(t)+Q_2(t)\cos(\Delta\omega+\theta_0)-I_2(t)\sin(\Delta\omega t+\theta_0). \quad (5)$$

and where $\Delta\omega=(\omega_{c2}-\omega_{c1})$ denotes the frequency spacing.

From equation (3), the envelope of the dual band signal is expressed as:

$$\begin{aligned} a_{DB}^2(t) &= \hat{I}^2(t)+\hat{Q}^2(t), \\ &= I_1^2(t)I_2^2(t)+Q_1^2(t)+Q_2^2(t)+ \\ &\quad 2(I_1(t)I_2(t)-Q_1(t)Q_2(t))\cos(\Delta\omega+\theta_0)+ \\ &\quad 2(Q_1(t)I_2(t)+I_1(t)Q_2(t))\sin(\Delta\omega+\theta_0). \end{aligned} \quad (6)$$

According to equation (6), the envelope of the dual-band signal is composed of two components: i) a low frequency component that depends exclusively on $I_1(t)$, $I_2(t)$, $Q_1(t)$ and $Q_2(t)$, and ii) a high frequency component that involves frequency spacing, $\Delta\omega$.

The envelope of the dual-band signal in equation (6) cannot be used to drive a typical envelope amplifier. The envelope of equation (6) would require a high speed (and consequently power inefficient) envelope amplifier since the frequency spacing can be on the order of hundreds of megahertz. The low frequency component of the envelope of the dual-band signal is calculated as the envelope of $a_{DB}(t)$ (i.e., the envelope of the envelope of the dual-band signal). The envelope of the envelope of the dual band signal is given by:

$$a_{LF}(t)=\sqrt{I_1^2(t)+Q_1^2(t)}+\sqrt{I_2^2(t)+Q_2^2(t)} \quad (7)$$

According to equation (7), the bandwidth of the $a_{LF}(t)$ signal is the same as the bandwidth of the envelope of the individual signals making up the dual band signal. Hence, if $a_{LF}$ is used to modulate the drain supply of a dual-band ET PA rather than the envelope of the dual band signal, this will enable use of an envelope amplifier having a bandwidth that is about equal to a bandwidth of a single-band ET PA, thus eliminating a need for an envelope amplifier having a bandwidth that encompasses the frequency spacing $\Delta\omega$.

Figure 1:
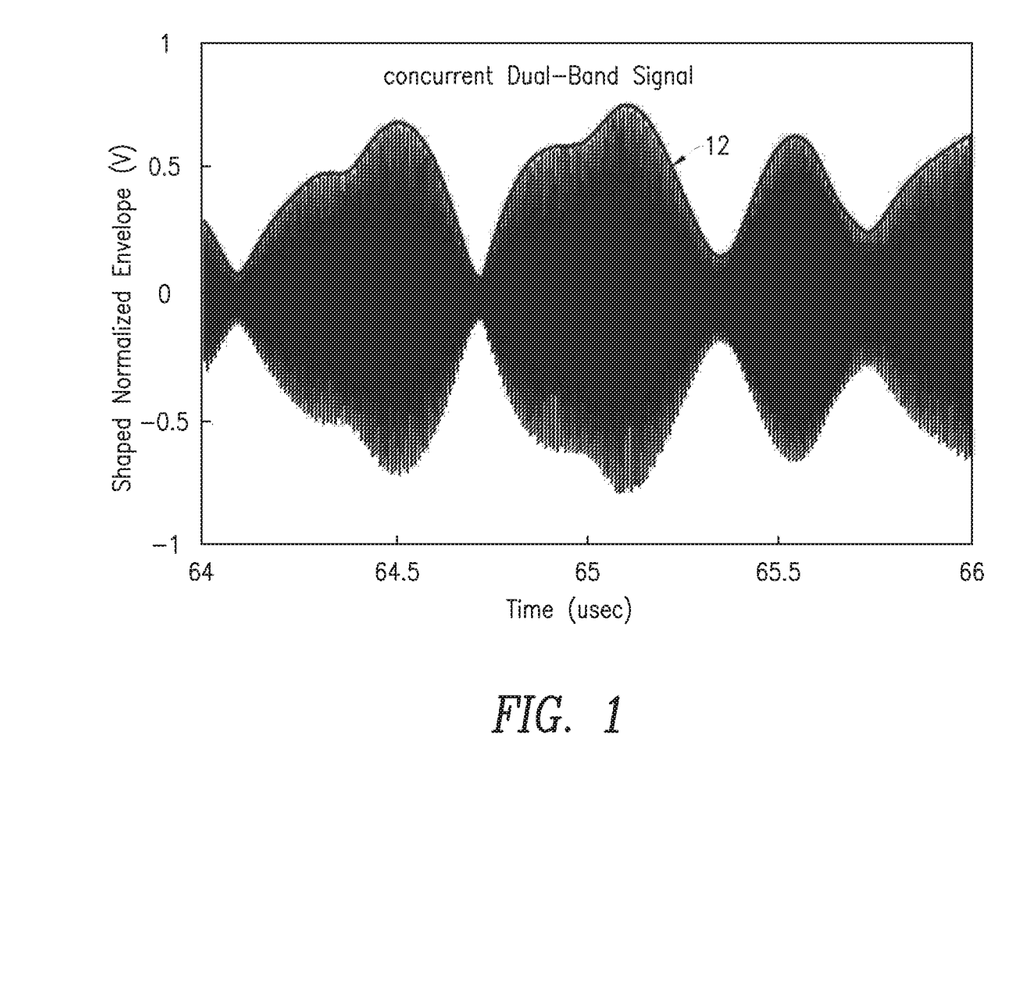
FIG. 1 is a graph of a dual band modulated signal.
Figure 2:
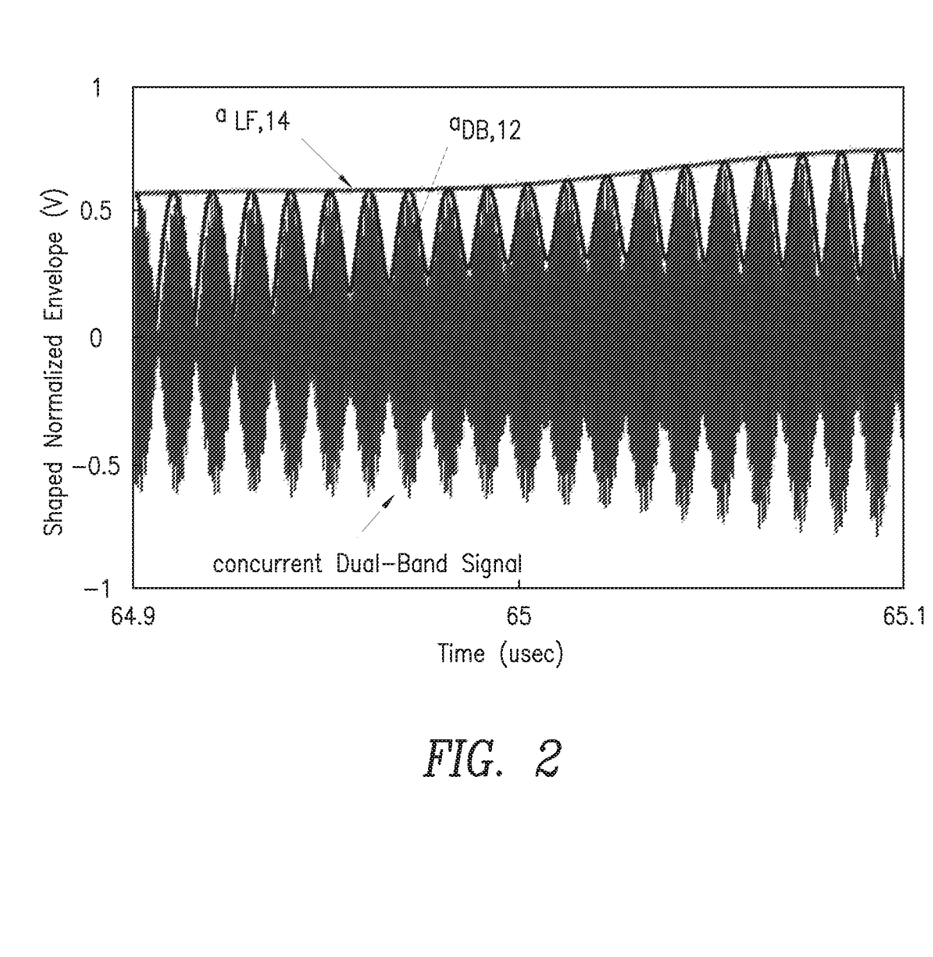
FIG. 2 is a graph of a portion of the dual band modulated signal of FIG. 1, showing the envelope of the dual band modulated signal and a low frequency component of the envelope.

FIG. 1 shows the envelope, $a_{DB}$, 12, of the dual-band signal given in equation (6). FIG. 2 is an expanded view of 0.2 microseconds of the signal of FIG. 1, and shows the low frequency component (LTC), $a_{LF}$, 14, given in (7). In FIGS. 1 and 2, the carrier frequencies are 2.05 GHz and 2.15 GHz, although the invention is not limited to these frequencies. These carriers are modulated according to downlink long term evolution (LTE) 5 MHz and single-carrier wideband code division multiple access (WCDMA), respectively. In this example, the individual single-band signals have a PAPR of 9.5 dB and 9.1 dB, respectively, and the combined dual band signal has a PAPR of 8.2 dB.

Comparison of the LFC 14 and the envelope 12 of the dual band signal shows that the LFC 14 varies much slower than the envelope 12. Therefore, using the LFC of the envelop, of the dual-band signal, $a_{LF}(t)$, for modulation of the drain of the power amplifier rather than using the complete envelope of the dual-band signal, $a_{DB}(t)$, addresses one of the main obstacles in developing ET PAs for concurrent dual-band transmission. Namely, the bandwidth of an envelope amplifier that amplifies the LFC 14 is much less than the bandwidth of an envelope amplifier that amplifies the envelope 12 of the dual band signal.

As shown in FIG. 2, the LFC of the envelope of the dual-band signal does not follow its instantaneous envelope. This results in a drain supply voltage that does not always correspond to the instantaneous radio frequency (RF) signal at the input of the PA. In other words, the employment of the envelope of $a_{DB}(t)$, $a_{LF}(t)$, results in a drain supply voltage that can be higher than necessary for a given input signal power, resulting in a contraction of efficiency.

Figure 3:
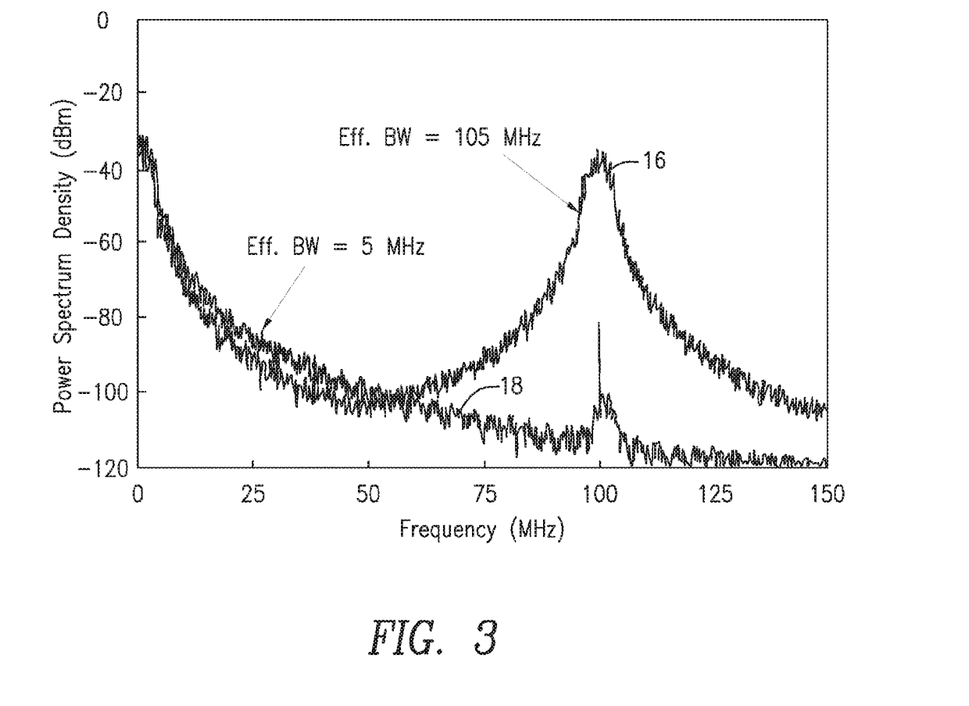
FIG. 3 is graph of a power spectrum density for both the envelope of the dual band modulated signal and the low frequency component of the envelope.

This can be observed in FIG. 3, which shows the power spectrum density versus frequency for the envelope 16 of the dual band signal and the low frequency component 18, i.e., the envelope of the envelope of the dual band signal. Note that the value of $a_{LF}(t)$ is higher than $a_{DB}(t)$ at times. The value of $a_{LF}$ being higher than $a_{DB}(t)$ at times leads to a contraction in the efficiency enhancement of the ET operation. At worst, the efficiency of the ET operation will match the efficiency of the PA under constant drain supply voltage operation. However, the efficiency of ET using the low frequency component of the envelope to modulate the drain supply voltage of the power amplifier is much better than efficiency under constant drain supply voltage, as explained below.

For example, in the case of an ET system with an ideal class-AB biased PA, the general form of the drain efficiency at a given normalized input signal envelope, $a_{DB}(t)$, and output power, Pout(t), excluding losses in the envelope amplifier, may be calculated as:

$$\eta(P_{out})=\frac{P_{out}(t)}{P_{DC}}=\frac{P_{out}(t)}{V_{DD}(P_{out})I_{DD}(P_{out})}, \quad (8)$$

where $V_{DD}(P_{out})=V_{DD,max}\times a(t)$ and $P_{out}(t)\propto a_{DB}^2(t)$. Applying equation (8) to the following two cases of a dual-band envelope tracker: i) the drain supply voltage being controlled using the complete dual-band signal envelope, $a_{DB}$, and ii) the drain supply voltage being controlled by only the LFC of the dual-band envelope, $a_{LF}$, results in:

$$\eta_{DB}(P_{out})=\frac{1}{a_{DB}(t)}=\frac{ka_{DB}^2(t)}{V_{DD}(P_{out})I_{DD}(P_{out})}, \quad (9)$$

$$\eta_{LF}(P_{out}) = \frac{1}{a_{LF}(t)} \quad (10)$$

$$= \frac{ka_{DB}^2(t)}{V_{DD}(P_{out})I_{DD}(P_{out})},$$

$$= \frac{a_{DB}(t)}{a_{LF}(t)} \eta_{DB}(P_{out}).$$

When the dual-band ET PA is driven with a modulated signal with a given power density function (PDF), the average efficiencies obtained for the above two cases are related as follows:

$$\eta_{avg,LF} = \frac{\int_0^1 ka_{DB}^2 PDF_{DB}(a_{DB}) da_{DB}}{\int_0^1 \frac{ka_{LF}a_{DB}}{\eta_{DB}(ka_{DB}^2)} PDF_{LF}(a_{DB}) da_{DB}}, \quad (11)$$

$$\eta_{avg,DB} = \frac{\int_0^1 ka_{DB}^2 PDF_{DB}(a_{DB}) da_{DB}}{\int_0^1 \frac{ka_{DB}^2}{\eta_{DB}(ka_{DB}^2)} PDF_{DB}(a_{DB}) da_{DB}},$$

where $\eta_{avg,DB}$ and $\eta_{avg,LF}$ denote the average efficiency of the concurrent dual-band ET PA using the complete envelope of the dual-band signal and using the LFC of the envelope, respectively. The functions $PDF_{DB}$ and $PDF_{LF}$ represent the PDF of the complete envelope of the dual-band signal and the LFC, respectively. One can define $\gamma_{CF}$ as the efficiency contraction factor attributed to the envelope simplification as follows:

$$\gamma_{CF} = \frac{\eta_{avg,LF}}{\eta_{avg,DB}} \quad (12)$$

$$= \frac{\int_0^1 a_{LF} \frac{ka_{DB}}{\eta_{DB}(ka_{DB}^2)} PDF_{LF}(a_{DB}) da_{DB}}{\int_0^1 \frac{ka_{DB}^2}{\eta_{DB}(ka_{DB}^2)} PDF_{LF}(a_{DB}) da_{DB}}.$$

According to equation (12), the efficiency contraction factor is a function of the individual signal characteristics (e.g., PDF and PAPR), and is independent of frequency spacing (i.e., $\Delta\omega$). In the case of an ideal class-B biased PA, equation (12) can be simplified as:

$$\gamma_{CF} = \frac{\int_0^1 a_{LF} PDF_{LF}(a_{DB}) da_{DB}}{\int_0^1 a_{DB} PDF_{LF}(a_{DB}) da_{DB}}. \quad (13)$$

The application of equation (13) to the previously mentioned dual-band signal formed by downlink LTE 5 MHz and single-carrier WCDMA signals, as shown in FIGS. 1 and 2, results in an efficiency contraction factor of 80% when the PA is biased in class-B. When the PA is biased in class-AB with a conduction angle of 200 (where GaN PAs are typically biased in practice) the efficiency contraction factor increases significantly to 94%. The significant increase in the efficiency contraction factor when the PA is biased in class-AB is due to the efficiency characteristics of the PA versus supply voltage and input power.

Figure 4:
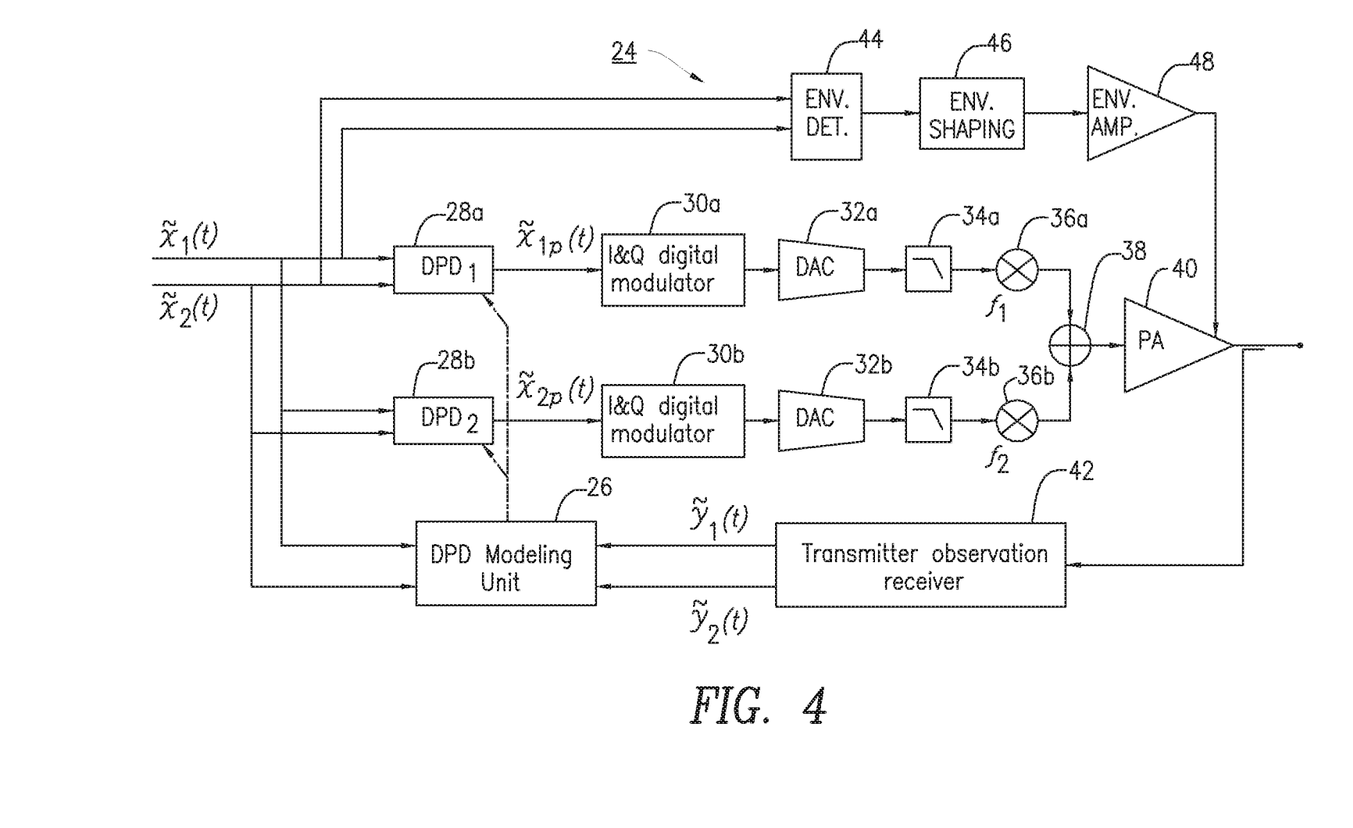
FIG. 4 is a block diagram of a power amplification system with envelope tracking, constructed in accordance with principles of the present invention.

FIG. 4 is a block diagram of an exemplary power amplification system 24 that employs envelope tracking to modulate the drain supply voltage of a power amplifier 40. Two digital pre-distorters (DPDs) 28a and 28b, referred to collectively as DPDs 28, receive input from the pre-distorter modelling unit 26. The DPDs 28 pre-distort the input signals $x_1$ and $x_2$ to produce pre-distorted signals. Each pre-distorted signal is input to a corresponding digital modulator 30a or 30b, referred to collectively as digital modulators 30, to impress the baseband signal onto a respective carrier. The signals are then converted to analog by a corresponding digital to analog convertor (DAC) 32a or 32b referred to collectively as DACs 32. The output of the DACs 32 are low pass filtered by a corresponding filter 34a or 34b, referred to collectively as low pass filters 34. The output of the low pass filters 34 are mixed to radio frequency (RF) by a corresponding mixer 36a or 36b, referred to collectively as mixers 36, to prepare the signal for amplification by an RF PA amplifier. Accordingly, the RF signals in the two paths are summed by an adder 38 and input to a power amplifier 40. When there are more than two signals in a multi-band input signal, there will be more than two paths, where each path for processing a separate one of the signals of the multi-band signal uses a corresponding DPD 28, digital modulator 30, DAC 32, low pass filter 34 and mixer 36. The signals processed in each path will be combined by the adder 38.

In the feedback path, a transmitter observation receiver 42 samples the output of the power amplifier 40 in each band and produces output signals $y_{1(t)}$ and $y_{2(t)}$. These output signals are used by the DPD modeling unit 26. According to some embodiments, the DPD modelling unit 26 calculates a discrete baseband equivalent Volterra series having distortion products grouped according to determined shared kernels, where the shared kernels are based on a transformation of a real-valued continuous-time pass band Volterra series without pruning of kernels.

Returning to FIG. 4, the input signals $x_1(t)$ and $x_2(t)$ are also fed to a low pass envelope detector 44 which detects the low frequency component of the envelope of the dual band signal, ($x_1(t), x_2(t)$), as given above in equation (7). The LFC of the envelope may be shaped by an envelope shaper 46 and amplified by an envelope amplifier 48. The output of the envelope amplifier 48 modifies or modulates the drain supply voltage of the PA 40. Note that in some embodiments, the output of the envelope amplifier is directly connected to the drain supply voltage of the PA 40. Hence, as $a_{LF}(t)$ varies, the drain supply voltage of the PA also varies accordingly, via the envelope amplifier 48.

Thus, in some embodiments, a power amplification system using envelope tracking has a low pass envelope detector 44 configured to determine a low pass envelope of a multi-band modulated signal input to the power amplification system and to output the determined low pass envelope. Optionally, in some embodiments, an envelope shaper 46 shapes the low pass envelope before amplification. An envelope amplifier 48 is configured to receive and amplify the determined low pass envelope to produce an envelope amplifier output. The power amplifier 40 has a drain supply that is modulated by the envelope amplifier output received from the envelope amplifier. In some embodiments, the bandwidth of the low pass envelope is about equal to the largest bandwidth of the individual signals comprising the multi-band modulated signal.

As described above, in some embodiments, the digital pre-distortion modelling unit 26 calculates a discrete baseband equivalent Volterra series having distortion products grouped according to determined shared kernels, where the shared kernels are based on a transformation of a real-valued continuous-time pass band Volterra series without pruning of kernels. Generation of the discrete baseband equivalent Volterra series is described in B. Fehri and S. Boumaiza, "Baseband equivalent Volterra series for digital predistortion of dual-band power amplifiers." IEEE Transactions on Microwave Theory and Techniques, vol. 62, no. 3, pp. 700-714, March 2014, which is incorporated herein in its entirety by reference for all purposes. To explain the approach, a discrete base band equivalent, BBE, Volterra series is generated based on the received dual band signal. The series has distortion products grouped according to determined shared kernels. The shared kernels are determined based on a transformation of a real-valued continuous-time pass band Volterra series without pruning of kernels. The transformation includes transforming the real-valued continuous time pass band Volterra series to a multi-frequency complex-valued envelope series. The multi-frequency complex-valued envelope signal is then transformed to a continuous-time pass band-only series. The continuous-time pass band-only signal is transformed to a continuous-time baseband equivalent series. The continuous-time baseband equivalent signal is discretized to produce the discrete base band equivalent Volterra series. Shared kernels of the discrete base band equivalent Volterra series are identified, where each shared kernel has at least two distortion products in common with another shared kernel.

To illustrate the use of Volterra series, the dual band power amplification system 24 can be treated as a dual input dual output system according to:

$$\tilde{y}_i(n) = f_i(\tilde{x}_1(n), \tilde{x}_2(n)) \quad (14)$$

where $\tilde{x}_i(n)$ and $\tilde{y}_i(n)$ are the baseband equivalent inputs and outputs of the dual-band PA for band i, respectively, and $f_i(\bullet)$ is the describing function of the PA behavior around band i. The baseband signals, $\tilde{x}_i(n)$ and $\tilde{y}_i(n)$ are sampled at a frequency which is only twice the largest bandwidth of the input signals and does not depend on the frequency separation between the two bands.

The expression of the dual-band Volterra DPD is given for the case of $3^{rd}$ order nonlinearity for simplicity as:

$$\tilde{y}_i(n) = \tilde{y}_{i,1}(n) + \tilde{y}_{i,3}(n) \quad (15)$$

where $\tilde{y}_{i,k}(n)$ is the $k^{th}$ order distortion term of the output for band i which includes both self-distortion and inter-distortion terms. The $1^{st}$ and $3^{rd}$ order distortion terms are defined using Volterra kernels as:

$$\tilde{y}_{i,1}(n) = \sum_{l_1=0}^{M_1} \tilde{h}_{i,1}(l_1) \tilde{x}_{i,1s}(n, l_1), \tilde{y}_{i,3}(n) \quad (16)$$

$$= \sum_{l_1=0}^{M_{3,s}} \sum_{l_2=0}^{M_{3,s}} \sum_{l_3=0}^{M_{3,s}} \tilde{h}_{i,3s}(l_1, l_2, l_3) \tilde{x}_{i,3s}(n, l_1, l_2, l_3) +$$

$$\sum_{l_1=0}^{M_{3,d}} \sum_{l_2=0}^{M_{3,d}} \sum_{l_3=0}^{M_{3,d}} \tilde{h}_{i,3d}(l_1, l_2, l_3) \tilde{x}_{i,3d}(n, l_1, l_2, l_3),$$

where $\tilde{h}_{i,1}$, $\tilde{h}_{i,3s}$ and $\tilde{h}_{i,3d}$ are the impulse responses of the Volterra kernels for the self and inter distortions of order 1 and 3 ($\tilde{x}_{1,s}(n)$, $\tilde{x}_{3,s}(n)$ and $\tilde{x}_{3,d}(n)$) respectively, and $M_1$, $M_{3,s}$ and $M_{3,d}$ denote the memory depth of the $1^{st}$ and $3^{rd}$ distortion terms.

The combination of ET and DPD techniques described above may allow efficiency in excess of 50% for single-band modulated signals. However, the extension of ET to concurrent amplification of dual-band signals requires mitigation of the sources of distortion which are greater under dual-band excitation than single band. To address this problem, the dual-band baseband equivalent Volterra model is extended to compensate for the distortion attributed to the drain supply modulation.

Therefore, according to some embodiments, the baseband envelope of the output signal in each band is expressed as a function of the envelope of the input signals, $\tilde{x}_1$ and $\tilde{x}_2$, as well as the supply voltage, $V_{DD}$.

$$\tilde{y}_i(n) = f_i(\tilde{x}_1(n), \tilde{x}_2(n)) \times F_{Ei}(V_{DD}(n)) \quad (17)$$

where $f_i(\bullet)$ is the dual-band PA describing function without supply modulation (i.e., constant supply) for band i, given in (14), and $f_{Ei}(V_{DD}(n))$ describes the dependency of the dual-band PA on the supply voltage for band i. Various expressions can be used for $f_{Ei}(V_{DD}(n))$.

According to one embodiment, a polynomial function is chosen that may achieve modeling capability with reduced complexity. Furthermore, knowing that the supply voltage of the dual-band ET is controlled using a shaped version of $|\tilde{x}_1(n)| + |\tilde{x}_2(n)|$, (17) can be simplified to:

$$\tilde{y}_i(n) = f_i(\tilde{x}_1, \tilde{x}_2) \times \sum_{l=0}^{N_S-1} c_l^{(i)} (|\tilde{x}_1(n)| + |\tilde{x}_2(n)|)^l \quad (18)$$

where $N_S$ is the nonlinearity order for the supply effect and $c_l^{(i)}$ are the model coefficients for band i. Note that this formulation assumes that the output does not depend on the past values of the supply voltage and the memory effects associated with the PA are captured by $f_i(\bullet)$. Note that the extension from a constant supply to a drain modulated PA do not provide satisfactory results with conventional two dimensional DPD schemes. According to some embodiments, the model coefficients in (18) can be identified linearly using a least square error estimator, but other methods will be recognized by those skilled in the art.

Thus, in some embodiments, an envelope tracking power amplification system has a pre-distorter configured to pre-distort a multi-band modulated signal according to a multi-band baseband equivalent Volterra model extended to compensate for distortion attributable to the drain supply modulation.

In order to improve the efficiency and linearity of single band ET PAs, the drain supply voltage is typically modulated according to the shaped envelope of the signal, rather than the original envelope. Different envelope shaping/modification techniques have been proposed for single band ET PAs to partially alleviate the bandwidth/efficiency and linearity/dynamic range requirements of the envelope amplifier.

Figure 5:
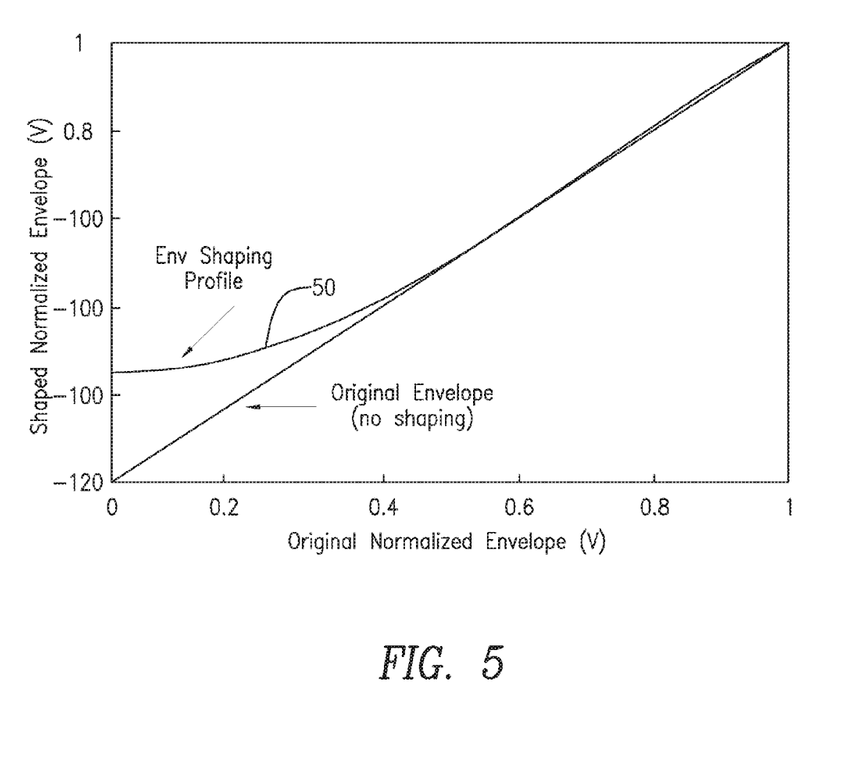
FIG. 5 is a graph of a shaping function for shaping the low frequency component of the envelope.

A general form of an envelope shaping function is given as:

$$\hat{a}(t) = b_0 + b_1 a^2(t) + b_2 a^4(t), \quad (19)$$

where a(t) and $\hat{a}(t)$ are the original and shaped envelope signals respectively. b, $b_1$ and $b_2$ are constant coefficients that are determined using the signal PAPR and knee voltage to ensure $\hat{a}(t) > a(t)$ and $\min(\hat{a}) = a_{min}$. FIG. 5 depicts an envelope shaping function 50 based on (19) where $a_{min} = 0.25$, corresponding to 12 dB of dynamic range.

Envelope shaping may be applied to the LFC of the envelope of the multi-band signal to reduce the linearity requirement of the envelope amplifier and improve the efficiency of the multi-band ET PA:

$$\hat{a}_{LF}(t) = f(a_{LF}(t)), \quad (20)$$

where $\hat{a}_{LF}(t)$ and $a_{LF}(t)$, are the shaped and original LFC of the dual-band envelope and f(•) is the envelope shaping function. Thus, in some embodiments, the power amplification system 24 includes an envelope shaper 46 configured to receive and shape the determined low pass envelope according to a polynomial function of the determined low pass envelope, and to output the shaped determined low pass envelope to the envelope amplifier.

To test the methods discussed above, two different power amplifiers were excited with dual band signals. A 10 W GaN dual-band ET PA with a linear supply modulator, and a broadband 45 W GaN dual-band ET PA operating at 1.9-2.9 GHz using a linear-assisted supply modulator were used as devices under test (DUT) to validate the dual-band Volterra DPD scheme with envelope tracking. Note that the supply voltage of the PA is modulated according to the shaped version $|\tilde{x}_1(n)|+|\tilde{x}_2(n)|$. This means that there is no additional bandwidth requirement on the envelope amplifier. It should be noted that the terms "envelope amplifier" and "envelope modulator" refer to the same element and are used interchangeably herein. Details of two measurement validation cases are given below:

Case I—10 W GaN dual-band ET PA driven by a two carrier WCDMA (9.2 dB PAPR) and LTE 10 MHz (9.6 dB PAPR) signals at 2.0 GHz and 2.2 GHz respectively.

Case II—45 W GaN dual-band ET PA driven by a single carrier WCDMA (9.1 dB PAPR) and LTE 5 MHz (9.4 dB PAPR) signals at 2.1 GHz and 2.9 GHz respectively. A dual-band Volterra series with $N_S=3$, $N=5$, $M_1=5$ and $M_3=2$ was used to linearize both DUTs with 60 coefficients for each band. According to Table I below, an adjacent channel power ratio (ACPR) of better than −47 dBc and an error vector magnitude (EVM) of less than 1.5% was achieved in both cases. The ET PA achieved 55% and 58% drain efficiency (excluding losses in the envelope amplifier) at 30 dBm and 37 dBm output powers for Case I and II, respectively. These results show 30% efficiency improvement compared to constant supply operation. Table I: Measurement results of 10 W and 45 W GaN dual band ET PAs for the two cases, where NMSE is the normalized mean square error.

|  |  | No DPD | | With DPD | |
|---|---|---|---|---|---|
|  |  | Band 1 | Band 2 | Band 1 | Band 2 |
| Case I | No. of coeff. | — | — | 60 | 60 |
|  | NMSE (dB) | — | — | −37.5 | −39.5 |
|  | ACPR (dBc) | −28.3 | −27.2 | −47 | −48 |
|  | EVM (%) | 12.3 | 11.5 | 1.46 | 1.37 |
| Case II | No. of coeff. | — | — | 60 | 60 |
|  | NMSE (dB) | — | — | −37.0 | −37.6 |
|  | ACPR (dBc) | −36 | −34.7 | −49.9 | −50.1 |
|  | EVM (%) | 8.0 | 9.0 | 1.4 | 1.5 |

Figure 6:
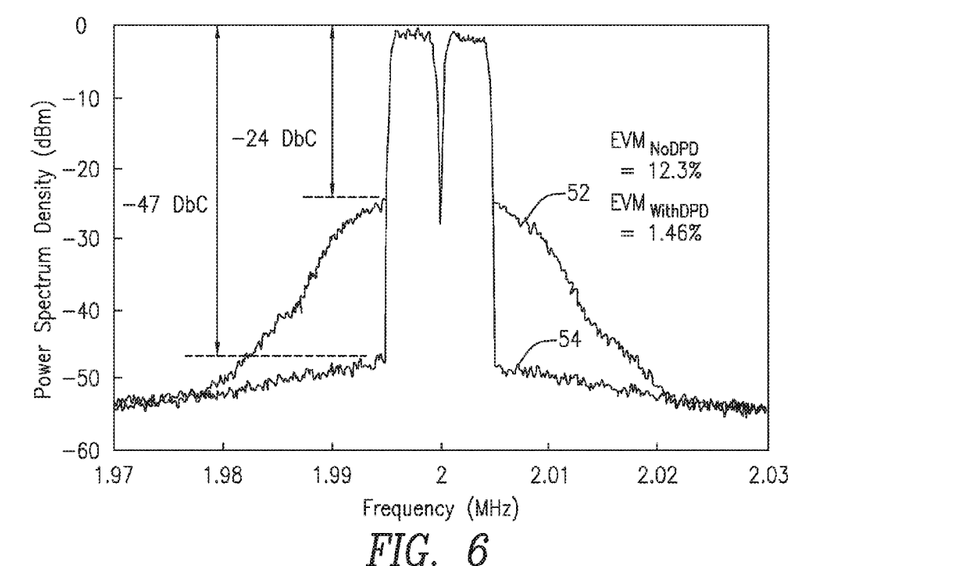
FIGS. 6 and 7 are graphs of the measured output spectrum of a first tested ET power amplifier at two bands with and without digital pre-distortion.
Figure 7:
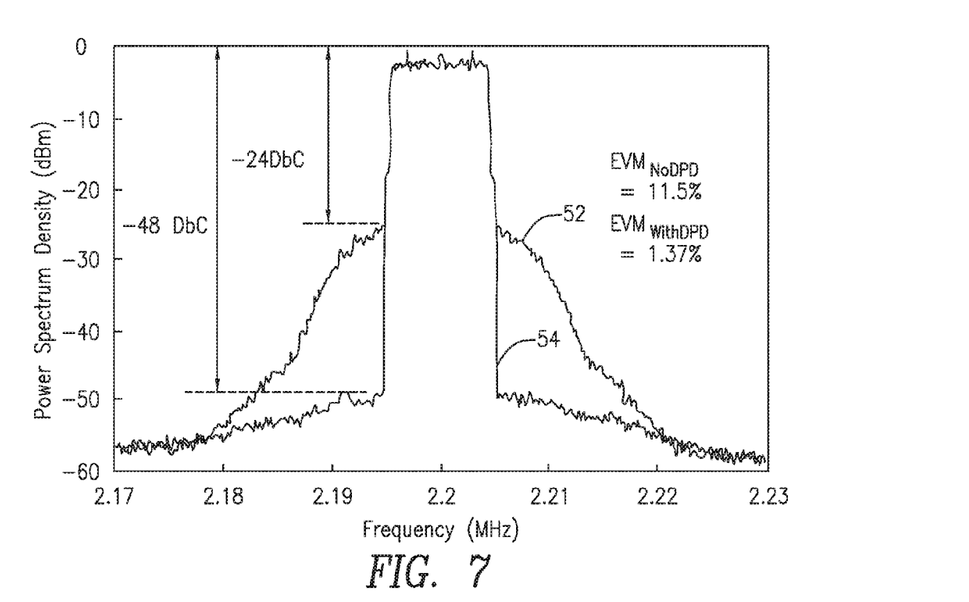
Figure 8:
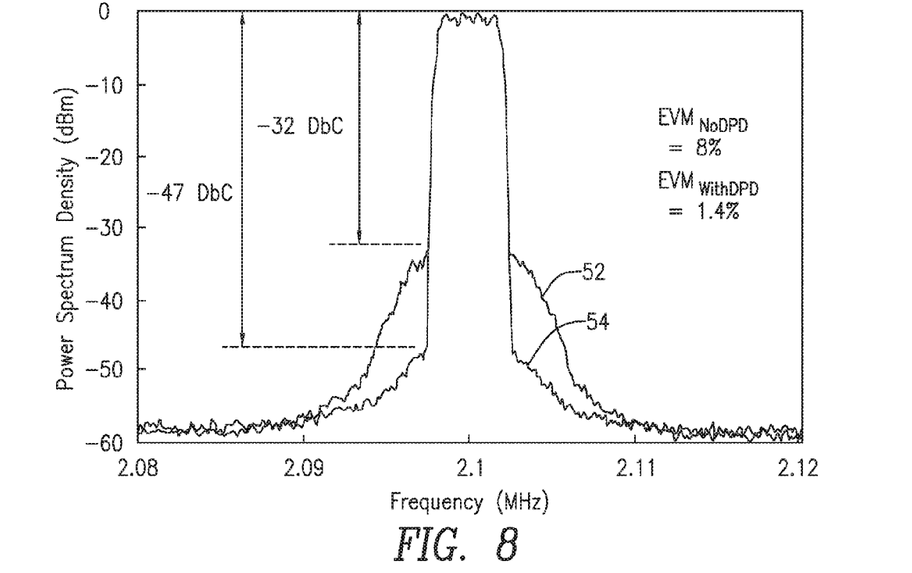
FIGS. 8 and 9 are graphs of the measured output spectrum of a second tested power amplifier at two bands with and without digital pre-distortion.
Figure 9:
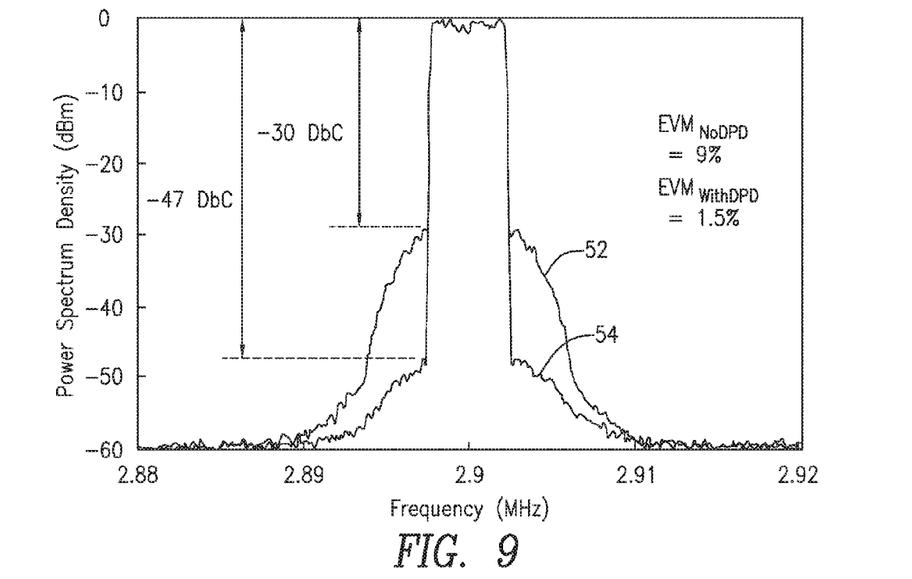

FIGS. 6 and 7 show the measured output spectrum of the tested ET power amplifier for Case I without DPD linearization 52 and with DPD linearization 54. FIG. 6 is the WCDMA spectrum and FIG. 7 is the LTE spectrum. FIGS. 8 and 9 show the measured output spectrum of the tested ET power amplifier for Case II without DPD linearization 52 and with DPD linearization 54. FIG. 8 is the WCDMA spectrum and FIG. 9 is the LTE spectrum. As can be seen, the proposed dual-band ET Volterra scheme successfully compensated for the out-of-band emission and EVM. A 25 dB reduction over the spectrum generated without DPD linearization is achieved for two different ET PAs with different access technologies, signal bandwidths and frequency spacing.

Figure 10:
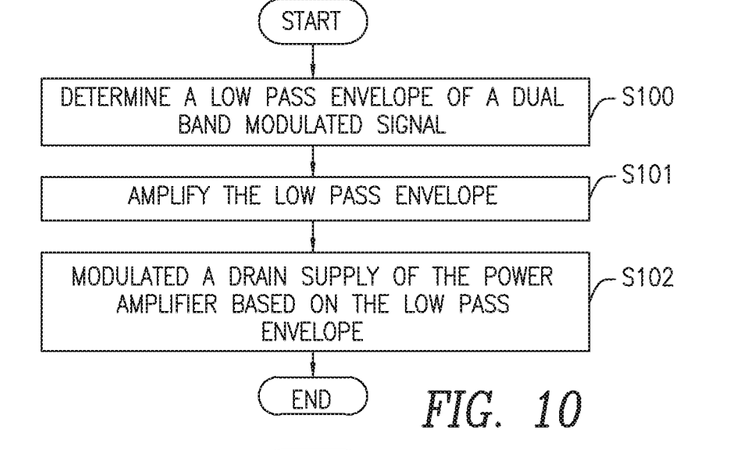
FIG. 10 is a flowchart of an exemplary process for envelope tracking applied to a power amplifier according to principles of the present invention.

FIG. 10 is a flowchart of an exemplary process for drain supply modulation of a power amplifier. A low pass envelope of a dual band modulated signal is determined by the low pass envelope detector 44 (block S100). The low pass envelope is then amplified by the envelope amplifier 46 (block S101). A drain supply of the power amplifier 40 is modulated based on the low pass envelope of the dual band modulated signal (block S102).

Figure 11:
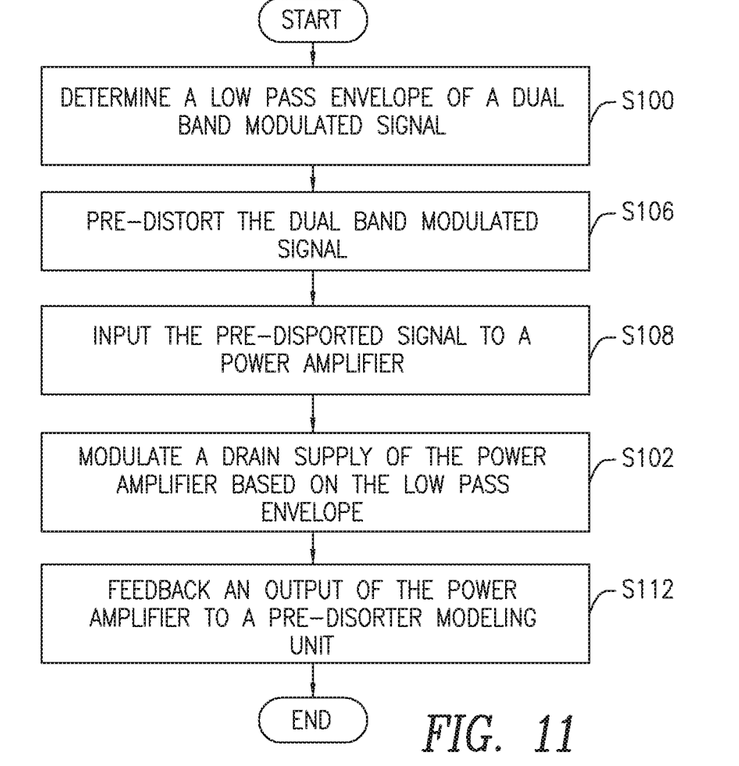
FIG. 11 is a flowchart of an exemplary process for envelope tracking and pre-distortion applied to a power amplifier according to principles of the present invention.

FIG. 11 is a more detailed flowchart of an exemplary process for drain supply modulation of the power amplifier 40. A low pass envelope of a dual band modulated signal is determined by the low pass envelope detector 44 (block S100). The dual band modulated signal is pre-distorted (block S106) by DPDs 28a and 28b, and input to the power amplifier 40 (block S108). A drain supply of the power amplifier 40 is modulated based on the determined low pass envelope (block S102). An output of the power amplifier 40 is fed back to the pre-distorter modelling unit 26 (block S112).

Thus, some embodiments employ envelope tracking via modulating the drain supply voltage of a power amplifier with a low frequency component of the envelope of the multi-band signal to be amplified. By using the low frequency component of the envelope, an envelope amplifier with a lower bandwidth may be used, resulting in greater efficiency and lower cost. Further, the multi-band input may be pre-distorted according to a baseband equivalent Volterra model extended to compensate for distortion attributable to the drain supply modulation.

The present invention can be realized in hardware, or a combination of hardware and software. Any kind of computing system, or other apparatus adapted for carrying out the methods described herein, is suited to perform the functions described herein. A typical combination of hardware and software could be a specialized computer system, having one or more processing elements and a computer program stored on a storage medium that, when loaded and executed, controls the computer system such that it carries out the methods described herein. The present invention can also be embedded in a computer program product, which comprises all the features enabling the implementation of the methods described herein, and which, when loaded in a computing system is able to carry out these methods. Storage medium refers to any volatile or non-volatile storage device.

Computer program or application in the present context means any expression, in any language, code or notation, of a set of instructions intended to cause a system having an information processing capability to perform a particular function either directly or after either or both of the following conversion to another language, code or notation; b) reproduction in a different material form.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A method of envelope tracking modulation of a power amplifier in a power amplification system, the method comprising:

determining a low pass envelope of a dual band modulated signal to the power amplification system, wherein the dual band modulated signal, $v_{DB}(t)$, is of the form:

$$v_{DB}(t) = v_1(t) + v_2(t)$$
$$= I_1(t)\cos(\omega_{c1}t) + Q_1(t)\sin(\omega_{c1}t) +$$
$$I_2(t)\cos(\omega_{c2}t + \theta_0) + Q_2(t)\sin(\omega_{c2}t + \theta_0);$$

where $\omega_{c1}$ is a carrier frequency of first signal, $v_1$, of the dual band modulated signal, $\omega_{c2}$ is a carrier frequency of second signal, $v_2$, of the dual band modulated signal, $\theta_0$ is a phase offset, I and Q are in-phase and quadrature components of a signal v, and wherein the low pass envelope is given by:

$$\alpha_{LF}(t) = (\sqrt{I_1^2(t) + Q_1^2(t)} + \sqrt{I_2^2(t) + Q_2^2(t)});$$

amplifying the determined low pass envelope; and
modulating a drain supply of the power amplifier based on the amplified determined low pass envelope.

2. The method of claim 1, wherein the low pass envelope is an envelope of an envelope of the dual band modulated signal.

3. The method of claim 1, wherein a bandwidth of the low pass envelope is about equal to a largest bandwidth of the first signal, $v_1$, and the second signal, $v_2$, comprising the dual band modulated signal.

4. The method of claim 1, wherein the determined low pass envelope is shaped according to a polynomial function of the determined low pass envelope prior to the amplifying.

5. The method of claim 1, further comprising pre-distorting the dual band modulated signal according to a dual band baseband equivalent Volterra model extended to compensate for distortion attributable to the drain supply modulation.

6. The method of claim 5, wherein the dual band baseband equivalent Volterra model extended to compensate for distortion attributable to the drain supply modulation is of the form:

$$\tilde{y}_i(n) = f_i(\tilde{x}_1, \tilde{x}_2) \times \sum_{l=0}^{N_S-1} c_l^{(i)} (|\tilde{x}_1(n)| + |\tilde{x}_2(n)|)^l$$

where $f_i$ is a dual band describing function without drain supply modulation for band i, Ns is a nonlinearity order for an effect of the drain supply modulation, $c_i$ are model coefficients for band i, and wherein $\tilde{x}_1$ and $\tilde{x}_2$ are baseband equivalent envelopes of the first signal, $v_1$, and the second signal, $v_2$, comprising the dual-band modulated signal.

7. The method of claim 6, wherein the model coefficients for band i, i.e., $c_i$, are identified linearly using a least square error estimator.

8. A power amplification system using envelope tracking for a power amplifier, the power amplifier having an input, an output and a drain supply, the power amplification system comprising:

a low pass envelope detector configured:
to determine a low pass envelope of a multi-band modulated signal to the power amplification system, wherein the multi band modulated signal is a dual band modulated signal, $v_{DB}(t)$, of the form:

$$v_{DB}(t) = v_1(t) + v_2(t)$$
$$= I_1(t)\cos(\omega_{c1}t) + Q_1(t)\sin(\omega_{c1}t) +$$
$$I_2(t)\cos(\omega_{c2}t + \theta_0) + Q_2(t)\sin(\omega_{c2}t + \theta_0);$$

where $\omega_{c1}$ is a carrier frequency of first signal, $v_1$, of the dual band modulated signal, $\omega_{c2}$ is a carrier frequency of second signal, $v_2$, of the dual band modulated signal, $\theta_0$ is a phase offset, I and Q are in-phase and quadrature components of a signal v and wherein the low pass envelope is given by:

$$\alpha_{LF}(t) = (\sqrt{I_1^2(t) + Q_1^2(t)} + \sqrt{I_2^2(t) + Q_2^2(t)}), \text{ and}$$

to output the determined low pass envelope; and
an envelope amplifier configured to modulate the drain supply of the power amplifier according to the determined low pass envelope received from the envelope detector.

9. The power amplification system of claim 8, wherein the low pass envelope detector is configured to detect an envelope of an envelope of the multi-band modulated signal.

10. The power amplification system of claim 8, wherein a bandwidth of the low pass envelope is about equal to a largest bandwidth of the first signal, $v_1$, and the second signal, $v_2$, individual signals comprising the multi-band modulated signal.

11. The power amplification system of claim 8, further comprising an envelope shaper configured to receive and shape the determined low pass envelope according to a polynomial function of the determined low pass envelope, and to output the shaped determined low pass envelope to the envelope amplifier.

12. The power amplification system of claim 8, further comprising a pre-distorter configured to pre-distort the dual band modulated signal according to a multi-band baseband equivalent Volterra model extended to compensate for distortion attributable to the drain supply modulation.

13. The power amplification system of claim 12, wherein the multi-band baseband equivalent Volterra model extended to compensate for distortion attributable to the drain supply modulation is a dual band model of the form:

$$\tilde{y}_i(n) = f_i(\tilde{x}_1, \tilde{x}_2) \times \sum_{l=0}^{N_S-1} c_l^{(i)} (|\tilde{x}_1(n)| + |\tilde{x}_2(n)|)^l$$

where $f_i$ is a dual band describing function without drain supply modulation for band i, Ns is a nonlinearity order for an effect of the drain supply modulation, $c_i$ are model coefficients for band i, and wherein $\tilde{x}_1$ and $\tilde{x}_2$ are baseband equivalent envelopes of the first signal, $v_1$, and the second signal, $v_2$ comprising the multi-band modulated signal.

14. The power amplification system of claim 13, further comprising a least square estimator configured to linearly identify the model coefficients for band i, i.e., $c_i$.

15. A power amplification system using envelope tracking, the power amplification system comprising:

a low pass envelope detector configured to determine a low pass envelope of a multi-band modulated signal to the power amplification system and to output the determined low pass envelope;

an envelope amplifier configured to receive and amplify the determined low pass envelope to produce an envelope amplifier output;

a power amplifier having a drain supply that is modulated by the envelope amplifier output received from the envelope amplifier; and a pre-distorter configured to pre-distort the multi-band modulated signal according to a multi-band baseband equivalent Volterra model extended to compensate for distortion attributable to the drain supply modulation, wherein the multi-band baseband equivalent Volterra model is extended by multiplication by a function of the low pass envelope.

16. The power amplification system of claim 15, wherein a bandwidth of the low pass envelope is about equal to a largest bandwidth of individual signals comprising the multi-band modulated signal.

* * * * *